United States Patent
Yang et al.

(10) Patent No.: US 10,652,961 B2
(45) Date of Patent: May 12, 2020

(54) METHOD FOR AUTOMATICALLY REGULATING BLEEDER CURRENT AND LED SILICON-CONTROLLED-RECTIFIER DIMMING CIRCUIT

(71) Applicant: SHAANXI REACTOR MICROELECTRONICS CO., LTD, Xi'an (CN)

(72) Inventors: Shihong Yang, Xi'an (CN); Hu Wang, Xi'an (CN)

( * ) Notice: Subject to any disclaimer, the term of this patent is extended or adjusted under 35 U.S.C. 154(b) by 0 days.

(21) Appl. No.: 16/259,460

(22) Filed: Jan. 28, 2019

(65) Prior Publication Data

US 2019/0297696 A1    Sep. 26, 2019

Related U.S. Application Data

(63) Continuation of application No. PCT/CN2018/087974, filed on May 23, 2018.

(51) Int. Cl.
*H05B 33/08*  (2020.01)
*G01R 19/165*  (2006.01)

(52) U.S. Cl.
CPC ... *H05B 33/0815* (2013.01); *G01R 19/16528* (2013.01); *H05B 33/0848* (2013.01); *H05B 33/0887* (2013.01)

(58) Field of Classification Search
CPC ............ H05B 33/0812; H05B 33/0815; H05B 33/0809; H05B 33/0845; H05B 33/0824; H05B 33/0848; H05B 33/0887; Y02B 20/343; Y02B 20/347; F21V 23/003; F21Y 2115/10; G01R 19/16528
See application file for complete search history.

(56) References Cited

U.S. PATENT DOCUMENTS

| | | | |
|---|---|---|---|
| 9,144,128 B2* | 9/2015 | Shin | H05B 33/083 |
| 9,420,644 B1* | 8/2016 | Shum | H05B 33/089 |
| 9,949,325 B2* | 4/2018 | Boonen | H05B 33/0815 |
| 10,285,229 B2* | 5/2019 | Wang | H05B 33/0845 |
| 10,503,189 B1* | 12/2019 | Wang | G05F 3/262 |

* cited by examiner

*Primary Examiner* — Haissa Philogene
(74) *Attorney, Agent, or Firm* — W&K IP

(57) ABSTRACT

A method of automatically regulating a bleeder current and an LED SCR dimming circuit are provided. According to the method, the SCR module can be controlled to be turned on reliably by detecting a leakage current when the SCR module is turned off and performing control for the bleeder current based on the size of the leakage current and correspondingly setting the size of the bleeder current, thereby greatly reducing power source loss and improving power source efficiency.

12 Claims, 4 Drawing Sheets

METHOD FOR AUTOMATICALLY REGULATING BLEEDER CURRENT AND LED SILICON-CONTROLLED-RECTIFIER DIMMING CIRCUIT

CROSS REFERENCE TO RELATED APPLICATIONS

This application is a continuation of International Patent Application No. PCT/CN2018/087974 with a filing date of May 23, 2018, designating the United States, now pending, and further claims priority to Chinese Patent Application No. 201810242969.8 entitled "METHOD FOR AUTOMATICALLY REGULATING BLEEDER CURRENT AND LED SILICON-CONTROLLED-RECTIFIER DIMMING CIRCUIT" filed on 2018 Mar. 22, the entire content of which is incorporated herein by reference.

TECHNICAL FIELD

The present disclosure relates to the field of LED dimming and in particular to a method of automatically regulating a bleeder current and an LED silicon-controlled-rectifier dimming circuit.

BACKGROUND

In an LED illumination field, a silicon-controlled-rectifier (SCR) dimming circuit is widely applied and the SCR dimming circuit features simple circuit structure, low cost, convenient use and strong controllability. With increase of market share of LED illuminating products, the SCR dimming circuit also plays an increasingly important role.

FIG. 1 is schematic diagram illustrating a structure of a circuit of an existing SCR module (SCRA). The SCR module has two states of turning on and turning off. After an SCR S1 is turned on, a holding current may flow through the SCR module (SCRA) to maintain the thyristor S1 in the turning-on state. Ideally, no current flows through the SCR module when the SCR is turned off. However, as shown in FIG. 1, the SCR is a modular structure and the module device cannot be in an ideal state. At the moment of turning off the SCR S1, there is still a current flowing through the SCR module. The current is a leakage current of the SCR module. Usually, the leakage current of the SCR module is very small with its value approximately being several milliamperes to a dozen of milliamperes and the holding current is greater than the leakage current.

An existing LED SCR dimming circuit performs dimming by using the above SCR module. As shown in FIG. 2, the LED SCR dimming circuit includes an SCR module 10, a rectifier module 20, and a constant current module 30. When a voltage on both ends of an LED lamp string is lower than a set voltage, the LED string is not turned on and there is no current flowing through. To reliably turn on the SCR module 10 at a particular angle, a bleeder circuit may be set in the LED dimming circuit. The bleeder circuit includes a power tube M1 and a resistor R3 for providing a current to the SCR module at the time of no current in the LED lamp string. Generally, a value of a bleeder current set by the bleeder circuit is greater than the holding current of the SCR module to ensure the SCR module 10 operates reliably.

After the SCR is changed from the turning-off state to the turning-on state, the SCR module is in a low resistance state. When a voltage after a phase cut is greater than a set voltage required to turn on the LED, there is a current flowing through the LED lamp string and the conduction current flowing through the SCR module is a current of the LED lamp string; when the voltage after the phase cut is smaller than the set voltage required to turn on the LED, the LED lamp string is not turned on and there is also no current flowing through. The conduction current flowing through the SCR module is mainly limited by the SCR module itself. In this case, the bleeder current is a conduction current flowing through the SCR module and therefore the current does not flow through the LED lamp string and is a loss current. Generally, the conduction current of the SCR is M times its leakage current. Different SCR modules may have different leakage currents. When an LED dimming circuit is designed, a bleeder current of a bleeder circuit is designed to be greater than a maximum leakage current to ensure the LED dimming circuit can be matched with most SCR modules, thereby realizing SCR dimming. Thus, the loss current designed for the bleeder circuit is also large. Particularly, when one SCR module controls N LED modules, because each of the LED modules is provided with a dimming circuit, the total bleeder current flowing through the SCR module may be N times of the bleeder current of a single dimming circuit, resulting in larger energy consumption.

At present, how to control the above bleeder current (in a case that the SCR is turned on and a circuit voltage is smaller than the conduction voltage of the LED) to reduce power source loss caused by the bleeder current and improve power source efficiency becomes a problem to be solved.

SUMMARY

The present disclosure is to solve the problem of how to control a bleeder current to improve power source efficiency. Corresponding bleeder currents are set automatically for different SCR modules so that a dimming circuit reduces a bleeder current accordingly in a case that the SCR cuts phase and turns on and corresponding power source voltage is smaller than a conduction voltage of an LED lamp string, thereby improving power source efficiency.

In order to achieve the above purpose of the present disclosure, the following technical solutions are adopted:

A method of automatically regulating a bleeder current, comprising:

detecting a leakage current when the SCR module in an LED SCR dimming circuit is turned off, and performing control on the bleeder current based on the size of the leakage current; and setting the size of the bleeder current and controlling the SCR module to be turned on reliably, where the bleeder current is a conduction current of the SCR module when the SCR module starts to turn on and a circuit voltage is smaller than a conduction voltage of an LED lamp string.

Preferably, the bleeder current is set to K times of the leakage current of the SCR module (10), where K is any value equal to or greater than 1.

Preferably, a current threshold is set. When the value of the leakage current of K times is greater than the current threshold, the value of the bleeder current is equal to the current threshold; when the value of the leakage current of K times is equal to or smaller than the current threshold, the value of the bleeder current is equal to the value of the leakage current of K times, where K is any value equal to or greater than 1.

Correspondingly, the present disclosure also provides an LED SCR dimming circuit for automatically regulating a bleeder current, including an SCR module (10), a rectifier circuit (20), a constant current control circuit (30), a bleeder circuit and a bleeder current control circuit (40).

Specifically, the SCR module (10) is connected to the rectifier circuit (20) to control a cut angle of the circuit.

The rectifier circuit (20) is connected with the bleeder circuit, the bleeder current control circuit (40) and an LED light source to rectify power supply.

The constant current control circuit (30) is connected to the LED light source to perform constant current control.

The bleeder circuit includes a power tube M1 and a bleeder resistor R3 for providing a current circuit to the SCR module (10) when a voltage on both ends of an LED lamp string is smaller than a set voltage.

A first end G1 of the bleeder current control circuit (40) is connected to a control end of the power tube M1, a second end A2 is connected to the bleeder resistor R3 and an output end of the power tube M1, a third end A1 is connected to a direct current power source end and a fourth end A4 is connected to the constant current control circuit (30); the bleeder current control circuit is used to perform control for the bleeder current based on the size of the leakage current of the SCR module (10) and the bleeder current is a conduction current of the SCR module when the SCR module starts to turn on and the voltage is smaller than a conduction voltage of the LED lamp string.

Preferably, the bleeder current control circuit (40), the bleeder resistor R3 and the power tube M1 are integrated into a same chip.

Preferably, when detecting the SCR module is turned off, the bleeder current control circuit (40) may sample a voltage V1 on one end of the bleeder resistor R3 and obtain the leakage current of the SCR module based on the voltage; when detecting that the SCR module starts to turn on and there is no current flowing through the LED lamp string, that is, the SCR is turned on and the voltage on both ends of the LED lamp string is smaller than the conduction voltage of the LED, the bleeder current control circuit (40) may control a conduction angle of the power tube M1 based on the size of the leakage current, thereby controlling the bleeder current flowing through the SCR module (10).

Preferably, the bleeder current control circuit (40) includes a voltage sampling module (410), a current sampling module (420), a cut angle detecting module (430) and a control outputting module (440); the voltage sampling module (410) has an end A2 for collecting data and its output end is connected to the control outputting module (440); one end of the control outputting module (440) is connected to an output end of the current sampling module (420), one end of the control outputting module (440) is connected to an output end of the cut angle detecting module (430), another end of the control outputting module (440) is connected to the output end of the voltage sampling module (410) and still another end G1 of the control outputting module (440) is connected to the control end of the power tube M1.

The voltage sampling module (410) is used to detect the leakage current of the SCR module, the current sampling module (420) is used to detect whether there is a current flowing through the LED lamp string, the cut angle detecting module (430) is used to detect whether the SCR is turned on, where the turning-on refers to a state after angle cut of the SCR and the state before angle cut of the SCR is a turning-off state; the control outputting module (440) is used to control a size of current flowing through the power tube M1 based on a leakage current signal H of the voltage sampling module (410), a lamp current signal N of the current sampling module (420), and a cut angle signal R of the cut angle detecting module (430).

Preferably, when the cut angle detecting module (430) detects that the SCR module (10) is in a turning-off state and a voltage on the output end of the rectifier circuit (20) is smaller than a voltage threshold, the cut angle detecting module (430) outputs a first cut angle signal to the control outputting module (440) which controls the power tube M1 to be turned on, the voltage sampling module (410) detects the voltage V1 on one end of the bleeder resistor R3, obtains the size of the leakage current of the SCR module (10) based on the voltage V1 and outputs the value of the leakage current to the control outputting module (440).

When detecting the SCR module (10) is in turning-on state, the cut angle detecting module (430) outputs a second cut angle signal to the control outputting module (440). At the same time, the current sampling module (420) detects no current flowing through the LED lamp string, and the control outputting module (440) obtains a first current I1 by amplifying the leakage current by K times based on the size of the leakage current. When the first current I1 is equal to or less than a current threshold and the second cut angle signal is received, the current flowing through the power tube M1 is controlled as a second current I2 based on the first current I1; when the first current I1 is greater than the current threshold and the second cut angle signal is received, the current flowing through the power tube M1 is controlled as a third current I3 based on the current threshold.

When the cut angle detecting module (440) detects that the SCR is in a turning-on state and the current sampling module (420) detects that there is a current flowing through the LED lamp string, the control outputting module (440) controls the power tube M1 to be turned off.

When the cut angle detecting module (430) detects that the voltage on the output end of the rectifier circuit is still greater than the voltage threshold and the current sampling module (420) detects that there is no current flowing through the LED lamp string again, the SCR module (10) is considered to be still in a turning-on state, and the control outputting module (440) controls the current flowing through the power tube M1 as a fourth current I4.

Preferably, the second current I2 is equal to the first current I1; the third current I3 is equal to the current threshold; the fourth current I4 is equal to a holding current of the SCR module (10) and not greater than the smaller of the first current I1 and the current threshold.

Preferably, the control outputting module (440) includes an amplifying unit (441), a controlling unit (442), and a driving unit (443). The amplifying unit (441) is used to amply the leakage current of the SCR module (10), the controlling unit (442) is used to output different control signals g based on the cut angle signal R and the lamp current signal N and drive signals G1 are output after the control signals g pass through the driving unit (443). The amplifying unit (441), the controlling unit (442), and the driving unit (443) are connected sequentially. Specific descriptions are made as follows:

When the cut angle signal R indicates the SCR is turned off and the lamp current signal N indicates that there is no current flowing through the LED lamp, the amplifying unit 441 may output an amplified current signal HA to the controlling unit 442 after amplifying the leakage current signal H by K times;

When the cut angle signal R indicates the SCR is turned on and the lamp current signal N indicates that there is no current flowing through the LED lamp, the power tube M1 is controlled in such a way that the current flowing through the SCR module is equal to the threshold or the leakage current of K times;

When the cut angle signal R indicates the SCR is continuously turned on and the lamp current signal N indicates that there is a current flowing through the LED lamp, the power tube M1 is turned off so that the current flowing through the SCR module is equal to the current in the LED lamp; and When the cut angle signal R indicates the SCR is continuously turned on and the lamp current signal N indicates that there is no current flowing through the LED lamp again, the power tube M1 is controlled in such a way that the current flowing through the SCR module is equal to the holding current.

Preferably, the bleeder current control circuit (40) performs segmented control based on the size of the leakage current. When the SCR starts to turn on and there is no current flowing through the LED lamp, the bleeder currents of different SCR modules are controlled as one fixed value based on the leakage currents of a same value range, where different leakage current value ranges correspond to different fixed values.

Preferably, the amplifying unit (441) is set with a plurality of set voltages, the controlling unit (442) selects corresponding different control voltages for the leakage currents of different value ranges, and the driving unit (443) controls the bleeder current of the SCR module as different fixed values based on the outputs of the controlling unit (442), where the plurality is equal to or greater than two.

It is can be seen that the present disclosure provides a method of automatically regulating a bleeder current and an LED SCR dimming circuit. According to the present disclosure, the conduction state of the SCR can be maintained by detecting the leakage current when the SCR module is turned off and correspondingly setting the size of the bleeder current based on the size of the leakage current, thereby greatly reducing the power source loss and improving the power source efficiency; when one SCR module controls N LED lamp dimming circuits, the leakage current of each circuit is 1/N of the leakage current of the SCR module so that the bleeder current of each circuit is 1/N of the bleeder current of the SCR when the SCR starts to turn on and there is no current flowing through the LED lamp string, and the bleeder current of the SCR is K times the leakage current. In this way, the power source loss is greatly reduced.

DETAILED DESCRIPTION

The present disclosure will be detailed below in combination with specific examples.

The present disclosure provides a method of automatically regulating a bleeder current. According to this method, an SCR module can be controlled to be reliably turned on by detecting a leakage current when the SCR module in an LED SCR dimming circuit is turned off, performing control for a bleeder current based on the size of the leakage current and correspondingly setting the size of the bleeder current. The bleeder current is a conduction current of the SCR module when a cut angle voltage of the SCR module is smaller than a conduction voltage of an LED lamp string. With this method, the power source loss can be reduced and the power source efficiency can be improved.

Preferably, the bleeder current is set to K times the leakage current of the SCR module 10, where K is any value equal to or greater than 1 and preferably 4. In this way, the SCR can be controlled to be turned on reliably.

Figure 1:
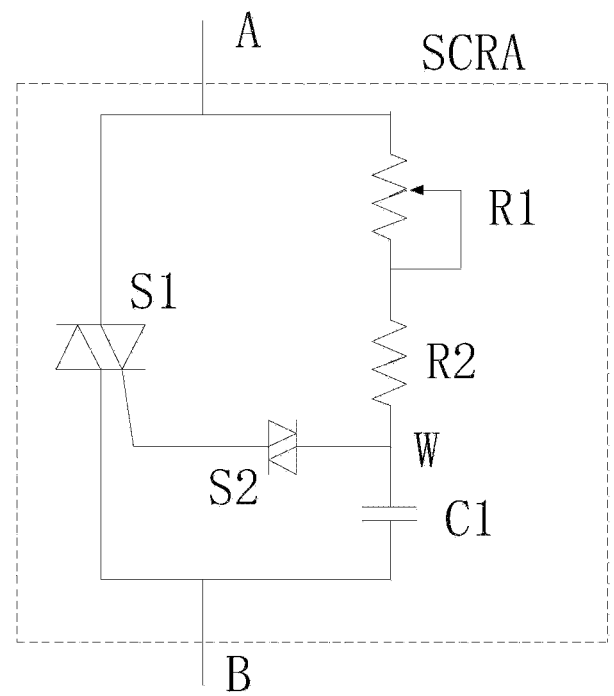
FIG. 1 is a schematic diagram illustrating a structure of a circuit of an SCR module in the prior art.
Figure 2:
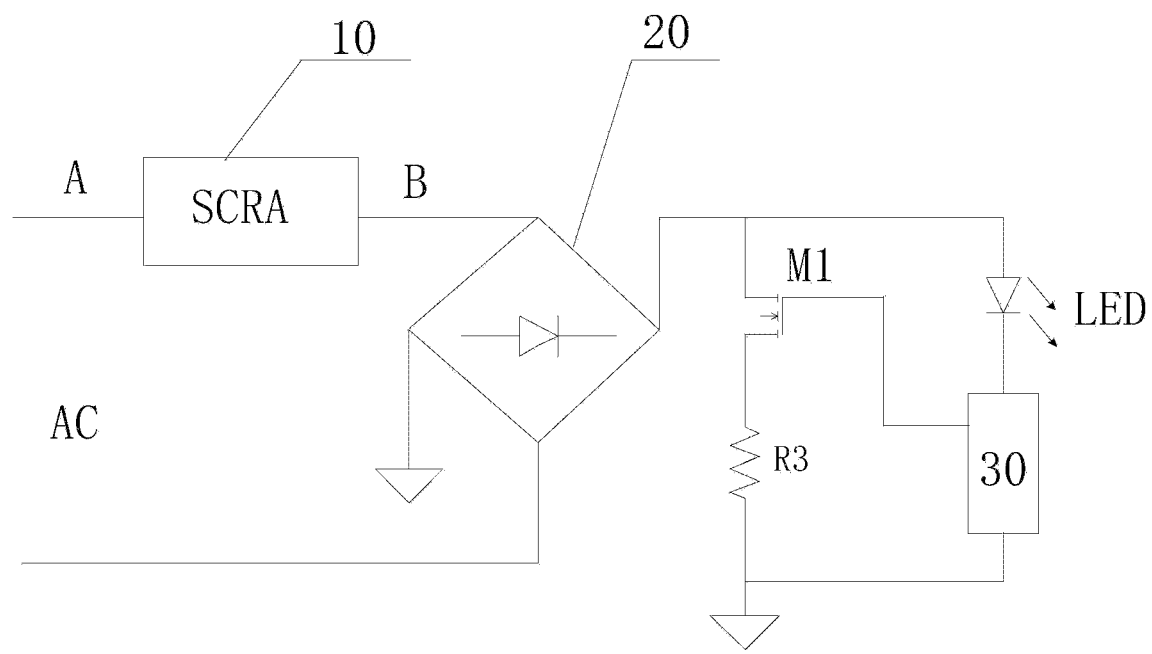
FIG. 2 is a schematic diagram illustrating a structure of an LED SCR dimming circuit in the prior art.
Figure 3:
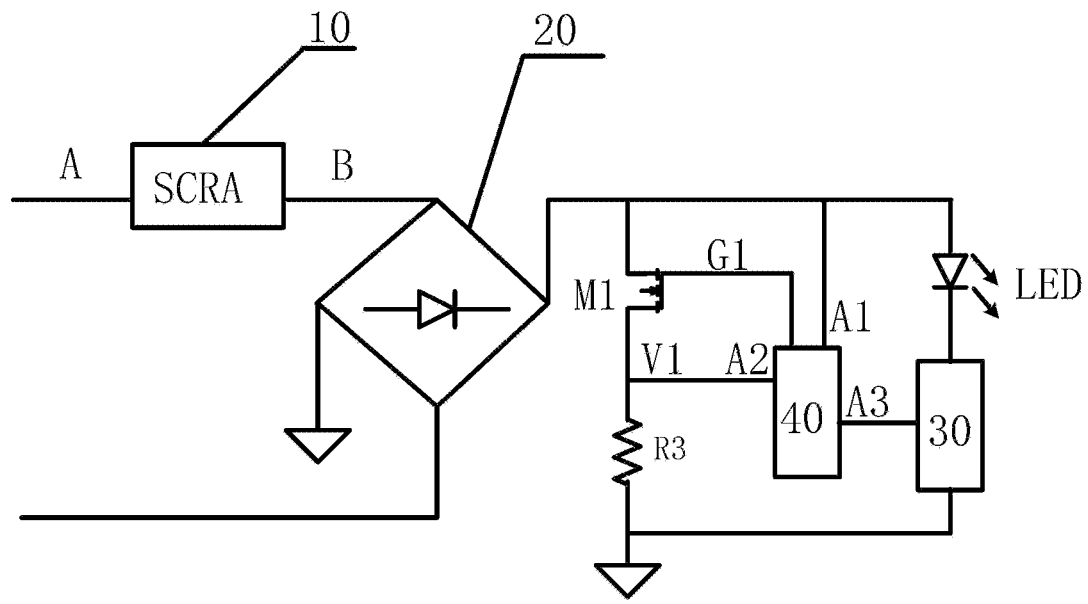
FIG. 3 is a schematic diagram illustrating a structure of an LED SCR dimming circuit for automatically regulating a bleeder current according to an example of the present disclosure.

To implement the above method, the present disclosure also provides an LED SCR dimming circuit for automatically regulating a bleeder current. As shown in FIG. 3, the LED SCR dimming circuit includes an SCR module 10, a rectifier circuit 20, a constant current control circuit 30, a bleeder current control circuit 40 and a bleeder circuit. The constant current control circuit 30 is used to control a current flowing through the LED lamp string as a constant current, the SCR module 10 is used to control a conduction cut angle of a circuit, the rectifier circuit 20 is used to rectify an alternating current power source into a half-wave direct current power source, and the bleeder circuit includes the power tube M1 and the bleeder resistor R3 for providing a current circuit for the SCR module 10 when there is no current flowing through the LED lamp string. In this way, the SCR module 10 can be turned on reliably. The bleeder current control circuit 40 is used to control the bleeder current based on the size of the leakage current so that the bleeder current can maintain the SCR reliably turned on, thereby improving power source efficiency and reducing power consumption.

Preferably, the bleeder current control circuit 40, the bleeder resistor R3 and the power tube M1 are integrated in a same chip. The bleeder current can be provided and controlled in the circuit by the same chip.

Further, in other implementations, the bleeder current can be controlled in another manner, for example, by setting a threshold current. When a leakage current after being amplified by K times is greater than the threshold current, the bleeder current is set to be equal to the threshold current.

Further, the specific connection structure of a circuit can be set. As shown in FIG. 3, a first end G1 of the bleeder current control circuit 40 is connected to a control end of the power tube M1, a second end A2 is connected to the bleeder resistor R3 and an output end of the power tube M1, a third end A1 is connected to a direct current power source end and a fourth end A3 is connected to the constant current control circuit 30. The end A1 is used to sample waveforms of the half-wave direct current power source; when the SCR is turned off, the end A2 samples the voltage V1 on one end of the bleeder resistor R3 and obtains the leakage current of the SCR module 10 based on the voltage; the end A3 is used to detect whether there is a current flowing through the LED lamp string. When the end A1 detects that the SCR module 10 is turned on and there is no current flowing through the LED lamp string, that is, the SCR module 10 starts to turn on and the voltage on both ends of the LED lamp string is smaller than the conduction voltage of the LED, the bleeder current control circuit 40 outputs a control signal to a control pole of the power tube M1 based on the size of the leakage current and controls the size of the conduction current of power tube M1, thereby controlling the bleeder current flowing through the SCR module 10.

Figure 4:
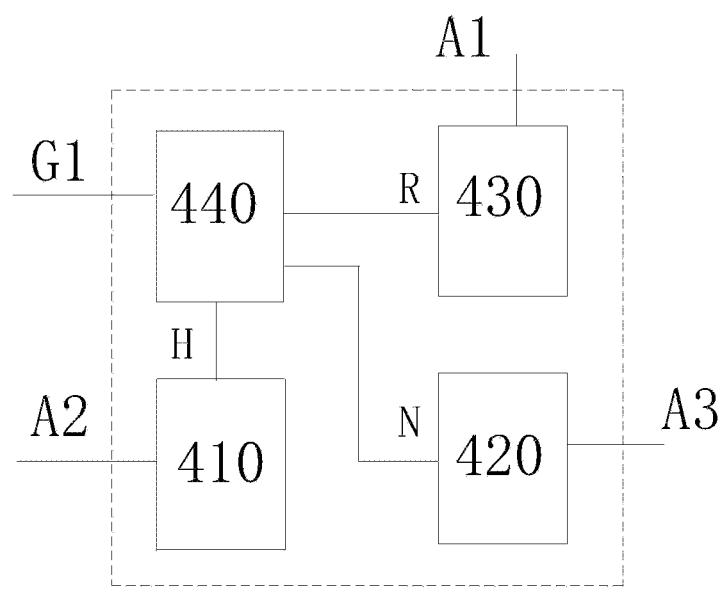
FIG. 4 is a schematic diagram illustrating a structure of a bleeder current control circuit according to an example of the present disclosure.

Further, in a specific example, the bleeder current control circuit 40 is designed for specific circuit structure. As shown in FIG. 4, the bleeder current control circuit 40 includes a voltage sampling module 410, a current sampling module 420, a cut angle detecting module 430 and a control outputting module 440. The voltage sampling module 410 is used to detect the leakage current of the SCR module 10, the current sampling module 420 is used to detect whether there is a current flowing through the LED lamp string, the cut angle detecting module 430 is used to detect whether the SCR is turned on, where the turning-on refers to a state after angle cut of the SCR and the state before angle cut of the SCR is a turning-off state; the control outputting module 440 is used to control sizes of currents flowing through the power tube M1 at different moments based on the leakage current signal H of the voltage sampling module 410, the lamp current signal N of the current sampling module 420, and the cut angle signal R of the cut angle detecting module 430.

The specific descriptions are made as follows:

when the cut angle detecting module 430 detects that the SCR module is in a turning-off state and a voltage on the output end of the rectifier circuit is smaller than the voltage threshold, the current sampling module 420 detects there is no current flowing through the LED lamp string, the cut angle detecting module 430 outputs a first cut angle signal to the control outputting module 440 which controls the power tube M1 to be turned on, the voltage sampling module 410 detects the voltage V1 on one end of the bleeder resistor R3, obtains the size of the leakage current of the SCR module based on the voltage V1 and outputs the value of the leakage current to the control outputting module 440.

When detecting the SCR is in turning-on state, the cut angle detecting module 430 outputs a second cut angle signal to the control outputting module 440. At the same time, the current sampling module 420 detects no current flowing through the LED lamp string, and the control outputting module 440 obtains a first current I1 by amplifying the leakage current by K times based on the size of the leakage current. When the first current I1 is less than the current threshold and the second cut angle signal is received, the current flowing through the power tube M1 is controlled as a second current I2 based on the first current I1; preferably, the second current I2 is equal to the first current I1; when the first current I1 is greater than the current threshold and the second cut angle signal is received, the current flowing through the power tube M1 is controlled as a third current I3 based on the current threshold; preferably, the third current I3 is equal to the current threshold.

When the cut angle detecting module 430 detects the SCR is in a turning-on state and the current sampling module 420 detects there is a current flowing through the LED lamp string, the control outputting module 440 controls the power tube M1 to be turned off.

When the cut angle detecting module 430 detects that the voltage on the output end of the rectifier circuit is still greater than the voltage threshold and the current sampling module 420 detects that there is no current flowing through the LED lamp string again, the SCR is considered to be still in a turning-on state, and the control outputting module 440 controls the current flowing through the power tube M1 as a fourth current I4. Preferably, the fourth current I4 is equal to the holding current of the SCR and more preferably, the fourth current I4 is less than or equal to the smaller of the first current I1 and the third current I3.

Figure 5:
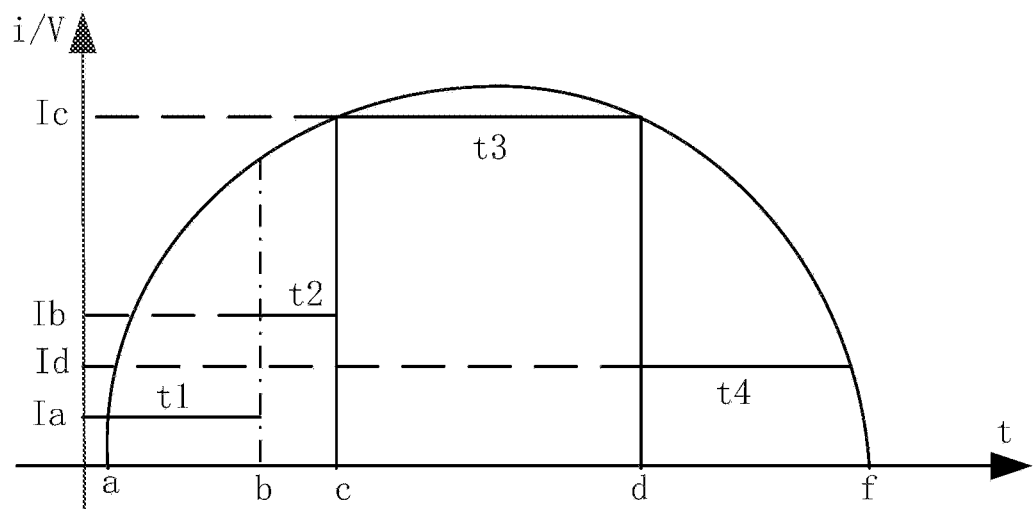
FIG. 5 is a schematic diagram illustrating waveforms of voltage and current of an output end of a rectifier circuit according to an example of the present disclosure.

To visually describe the above control process better, the control process will be described in combination with circuit parameter changes of an actual LED SCR dimming circuit. In the actual LED SCR dimming circuit, the voltage waveforms of the output end of the rectifier circuit 20 is as shown in FIG. 5. The corresponding control process is described as follows:

At a moment a, when the cut angle detecting module 430 detects the SCR is in a turning-off state and the voltage on the output end of the rectifier circuit is less than the voltage threshold, the cut angle detecting module 430 outputs the first cut angle signal to the control outputting module 440; at this time, the current sampling module 420 detects no current flowing through the LED lamp string, the control outputting module 440 controls the power tube M1 to be turned on, the voltage sampling module 410 detects the voltage V1 on one end of the bleeder resistor R3, obtains a leakage current of the SCR module as Ia based on the obtained voltage V1 and outputs the leakage current value Ia to the control outputting module 440; the leakage current flowing through the dimming circuit is maintained to a moment b;

At the moment b, when the cut angle detecting module 430 detects the SCR is in a turning-on state, the cut angle detecting module 430 outputs the second cut angle signal to the control outputting module 440 and at the same time, the current sampling module 420 detects there is no current flowing through the LED lamp string; the control outputting module 440 obtains the first current I1 by amplifying the leakage current Ia by K times based on the size of the leakage current Ia and controls the current flowing through the power tube M1 as the smaller of the first current I1 and the current threshold and sets the smaller to Ib; the dimming circuit maintains the current to a moment c.

At the moment c, when the cut angle detecting module 430 detects that the SCR is in a turning-on state and the current sampling module 420 detects that there is a current flowing through the LED lamp string, the control outputting module 440 controls the power tube M1 to be turned off. At this time, the current flowing through the circuit is a current Ic flowing through the LED lamp string, and the size of the current Ic is determined by the constant current control circuit 30; the dimming circuit maintains the current to a moment d.

At the moment d, when the current sampling module 420 detects that there is no current flowing through the LED lamp string again and the cut angle detecting module 430 detects that the SCR is still in a turning-on state, the control outputting module 440 controls the current flowing through the power tube M1 as Id and the above process is repeated after the current is maintained until the voltage on the output end of rectifier circuit is smaller than the voltage threshold again. Preferably, Id is equal to the holding current of the SCR and preferably the Id is smaller than the current Ib.

Figure 6:
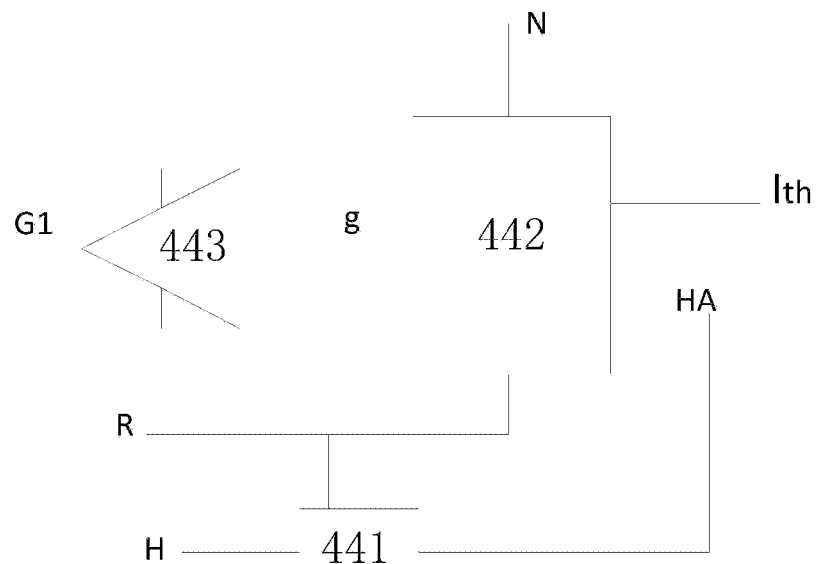
FIG. 6 is a schematic diagram illustrating a circuit structure of a control outputting module according to an example of the present disclosure.

In a further specific example, the control outputting module 440 is set for its specific circuit structure. As shown in FIG. 6, the control outputting module 440 includes an amplifying unit 441, a controlling unit 442, and a driving unit 443. The amplifying unit 441 is used to amply the leakage current of the SCR module, the controlling unit 442 is used to output different control signals g based on the cut angle signal R and the lamp current signal N and then different drive signals G1 for driving corresponding actions of the power tube M1 are output after the control signals g pass through the driving unit 443.

Specific descriptions are made below.

When a cut angle signal R output by the cut angle detecting module 430 indicates the SCR is turned off and the lamp current single N indicates there is no current flowing through the LED lamp string, the amplifying unit 441 outputs an amplified current HA to the controlling unit 442 after amplifying the leakage current H by K times.

When the cut angle signal R indicates the SCR starts to turn on and the lamp current signal N indicates there is no current flowing through the LED lamp string, the power tube M1 is controlled so that the current flowing through the SCR module is equal to K times of leakage current or the current threshold.

When the cut angle signal R indicates the SCR is continuously turned on and the lamp current signal N indicates there is a current flowing through the LED lamp string, the power tube M1 is turned off so that the current flowing through the SCR module is equal to the current in the LED lamp string.

When the cut angle signal R indicates the SCR is continuously turned on and the lamp current signal N indicates there is no current flowing through the LED lamp string again, the power tube M1 is controlled so that the current flowing through the SCR module is equal to the holding current.

In a specific example, to better match the SCR modules of different specifications, the controlling unit 442 summarizes different leakage currents of different SCRs that are amplified by K times based on the sizes and K times of a particular leakage current value in a particular value range is used as a reference current for the leakage currents of the particular value range. When the SCR is turned on and there is no current flowing through the LED lamp, the power tube M1 is controlled so that the current flowing through the SCR module is equal to the reference current or the current threshold.

Figure 7:
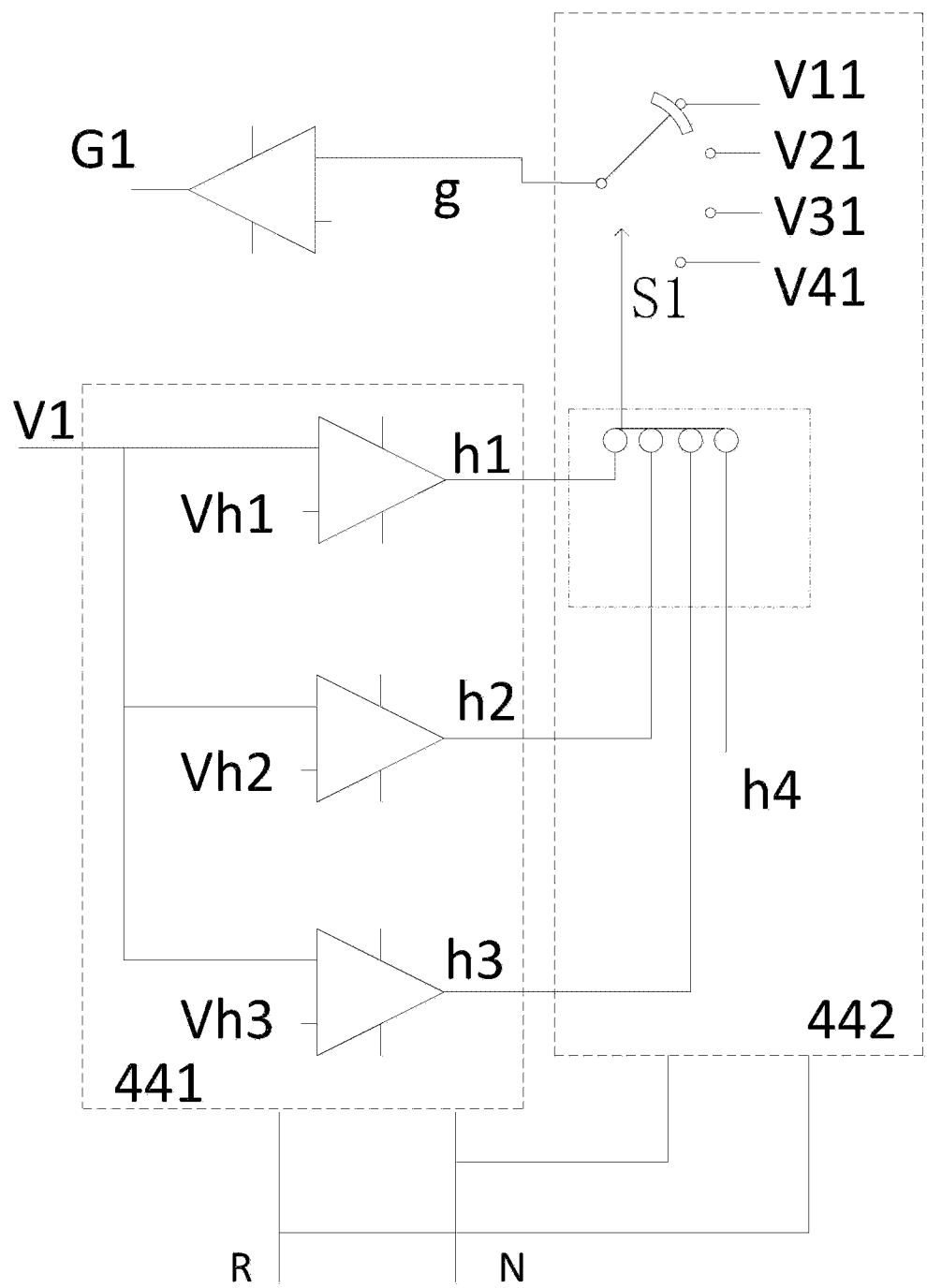
FIG. 7 is a schematic diagram illustrating a circuit structure of a control outputting module according to another example of the present disclosure.

In a further specific example, the amplifying unit 441 is set for its specific circuit structure. As shown in FIG. 7, the amplifying unit 441 does not amplify leakage current signals but sets a plurality of set voltages such as Vh1, Vh2 and Vh3 in FIG. 7. The amplifying unit 441 summarizes different leakage currents based on sizes of values, outputs one leakage current signal for the leakage currents of a particular value range and outputs different leakage current signals such as h1, h2 and h3 in FIG. 7 for leakage currents of different value ranges. The controlling unit 442 selects different control voltages V21, V31 and V41 signals based on different leakage current signals for the driving unit to output different dive signals. When the SCR starts to turn on and there is no current flowing through the LED lamp, the current flowing through the SCR module is controlled as a fixed value, where different leakage current value ranges correspond to different fixed values.

Correspondingly, it is assumed that the control voltages V41>V31>V21>V11 and the set voltages Vh3>Vh2>Vh1. When V1 is less than or equal to Vh1, the amplifying unit 441 outputs the leakage current signal h1 to the controlling unit 442; when V1 is greater than Vh1 and less than or equal to Vh2, the amplifying unit 441 outputs the leakage current signal h2 to the controlling unit 442; when V1 is greater than Vh2 and less than or equal to Vh3, the amplifying unit 441 outputs a first state of the leakage current signal h3 to the controlling unit 442; when V is greater than Vh3, the amplifying unit 441 outputs a second state of the leakage current signal h3 to the controlling unit 442. Preferably, the amplifying unit 441 adopts a multiplier.

Further, the control voltages V11, V21 and V31 are proportional to the set voltages Vh1, Vh2 and Vh3 respectively, for example, the control voltages V11, V21 and V31 are K times of the corresponding set voltages Vh1, Vh2 and Vh3 respectively.

Further, the controlling unit 442 is set with a reset signal h4 and reset to the control voltage V11 after each cycle. When the cut angle signal R indicates the SCR is turned off and the lamp current signal N indicates there no current flowing through the LED lamp, the controlling unit 442 controls a switch S1 to select conduction. A rule for the switch S1 to select conduction is as follows: when $V1 \leq Vh1$, the control voltage V11 is selected for the driving unit; when $Vh1 \leq V1 \leq Vh2$, the control voltage V21 is selected for the driving unit; when $Vh2 \leq V1 \leq Vh3$, the control voltage V31 is selected for the driving unit; when $Vh3 \leq V1$, the control voltage V41 is selected for the driving unit; and the controlling unit is reset to the control voltage V11 after each cycle.

Correspondingly, the leakage current can be amplified in advance. The control voltages V11, V21 and V31 are related to linearity of the leakage current. The set voltages Vh1, Vh2 and Vh3 are related to the linearity of the amplified leakage currents.

In conclusion, the present disclosure provides an LED SCR dimming circuit for performing automatic regulation for a bleeder current. According to the present disclosure, the conduction state of the SCR module can be maintained by detecting the leakage current when the SCR module is turned off and correspondingly setting the size of the bleeder current based on the size of the leakage current, thereby greatly reducing the power source loss and improving the power source efficiency; further, when one SCR module controls N LED lamp strings according to the present disclosure, the control chips of the N paths of LED lamp strings split the leakage current of the SCR module. Thus, the leakage current flowing through each path is 1/N of the leakage current of the SCR module. When the SCR is turned on and there is no current flowing through the LED lamp string, the bleeder current flowing through each path is 1/N of the bleeder current of the SCR module and the bleeder current of the SCR module is K times of the leakage current, thereby greatly reducing power source loss and improving power source efficiency.

The above examples are only illustrative of the present disclosure. It is to be understood that modification and variations of arrangements and details described herein are apparent for those skilled in the art. Thus, the present disclosure is only limited by the scope of the claims rather than limited by the details set out for description and explanation for the examples herein.

We claim:

1. A method for automatically regulating a bleeder current, comprising:
   detecting a leakage current when a silicon-controller rectifier (SCR) module in an LED SCR dimming circuit is turned off and performing control for the bleeder current based on the size of the leakage current;
   setting the size of the bleeder current to control the SCR module to be turned on reliably, wherein the bleeder current is a conduction current of the SCR module when the SCR module starts to turn on and a circuit voltage is smaller than a conduction voltage of an LED lamp string.

2. The method according to claim 1, comprising:
setting the bleeder current to K times of the leakage current of the SCR module (10), wherein K is any value equal to or greater than 1.

3. The method according to claim 1, comprising:
setting a current threshold, wherein, when a value of the leakage current of K times is greater than the current threshold, the value of the bleeder current is equal to the current threshold; and when the value of the leakage current of K times is less than or equal to the current threshold, the value of the bleeder current is equal to the value of the leakage current of K times; K is any value equal to or greater than 1.

4. An LED silicon-controlled rectifier (SCR) dimming circuit for automatically regulating a bleeder current, comprising: an SCR module (10), a rectifier circuit (20), a constant current control circuit (30), a bleeder circuit and a bleeder current control circuit (40); wherein,
the SCR module (10) is connected to the rectifier circuit (20) to control a cut angle of a circuit;
the rectifier circuit (20) is connected to the bleeder circuit, the bleeder current control circuit (40) and an LED light source to rectify power supply;
the constant current control circuit (30) is connected to the LED light source to perform constant current control;
the bleeder circuit comprises a power tube M1 and a bleeder resistor R3 for providing a current circuit for the SCR module (10) when there is no current in the LED lamp string; and
a first end G1 of the bleeder current control circuit (40) is connected to a control end of the power tube M1, a second end A2 is connected to the bleeder resistor R3 and an output end of the power tube M1, a third end A1 is connected to a direct current power source end and a fourth end A4 is connected to the constant current control circuit (30); the bleeder current control circuit is used to perform control for the bleeder current based on the size of the leakage current of the SCR module (10) and the bleeder current is a conduction current of the SCR module when the SCR starts to turn on and a voltage on both ends of an LED lamp string is smaller than a conduction voltage of the LED lamp string.

5. The LED SCR dimming circuit according to claim 4, wherein the bleeder current control circuit (40), the bleeder resistor R3 and the power tube M1 are integrated in a same chip.

6. The LED SCR dimming circuit according to claim 4, wherein, when detecting the SCR is turned off, the bleeder current control circuit (40) samples a voltage V1 on one end of the bleeder resistor R3 and obtains a leakage current of the SCR module based on the voltage; when detecting that the SCR module starts to turn on and there is no current flowing through the LED lamp string, the bleeder current control circuit (40) controls the size of the conduction current of the power tube M1 based on the size of the leakage current, thereby controlling the bleeder current flowing through the SCR module (10).

7. The LED SCR dimming circuit according to claim 4, wherein the bleeder current control circuit (40) comprises a voltage sampling module (410), a current sampling module (420), a cut angle detecting module (430) and a control outputting module (440); wherein,
one end of the control outputting module (440) is connected to an output end of the current sampling module (420), one end is connected to an output end of the cut angle detecting module (430), another end is connected to an output end of the voltage sampling module (410) and another end G1 is connected to a control end of the power tube M1;
the voltage sampling module (410) is used to detect a leakage current of the SCR module, the current sampling module (420) is used to detect whether there is a current flowing through the LED lamp string, and the cut angle detecting module (430) is used to detect whether the SCR is turned on, wherein the turning-on refers to a state after angle cut of the SCR and a state before angle cut of the SCR is a turning-off state; and
the control outputting module (440) is used to control the size of the current flowing through the power tube M1 based on a leakage current signal H of the voltage sampling module (410), a lamp current signal N of the current sampling module (420) and a cut angle signal R of the cut angle detecting module (430).

8. The LED SCR dimming circuit according to claim 7, wherein,
when the cut angle detecting module (430) detects the SCR module (10) is in a turning-off state and a voltage on an output end of the rectifier circuit (20) is smaller than a voltage threshold, the cut angle detecting module (430) outputs a first cut angle signal to the control outputting module (440), the control outputting module (440) controls the power tube M1 to be turned on and the voltage sampling module (410) detects the voltage V1 on one end of the bleeder resistor R3, obtains the size of the leakage current of the SCR module (10) based on the voltage V1 and outputs the value of the leakage current to the control outputting module (440);
when the cut angle detecting module (430) detects that the SCR module (10) is in a turning-on state, the cut angle detecting module (430) outputs a second cut angle signal to the control outputting module (440), at the same time, the current sampling module (420) detects there is no current flowing through an LED lamp string, and the control outputting module (440) obtains a first current I1 by amplifying the leakage current by K times based on the size of the leakage current; when the first current I1 is smaller or equal to the current threshold and the second cut angle signal is received, the current flowing through the power tube M1 is controlled as a second current I2 based on the first current I1; when the first current I1 is greater than the current threshold and the second cut angle signal is received, the current flowing through the power tube M1 is controlled as a third current I3 based on the current threshold;
When the cut angle detecting module (440) detects that the SCR is in a turning-on state and the current sampling module (420) detects that there is a current flowing through the LED lamp string, the control outputting module (440) controls the power tube M1 to be turned off; and
when the cut angle detecting module (430) detects the voltage on the output end of the rectifier circuit is still greater than the voltage threshold and the current sampling module (420) detects there is no current flowing through the LED lamp string again, the SCR module (10) is considered to be still in a turning-on state, and the control outputting module (440) controls the current flowing through the power tube M1 as a fourth current I4.

9. The LED SCR dimming circuit according to claim 8, wherein,
the second current I2 is equal to the first current I1; the third current I3 is equal to the current threshold; the fourth current I4 is equal to a holding current of the SCR module (10) and no greater than the smaller of the first current I1 and the current threshold.

10. The LED SCR dimming circuit according to claim 7, wherein, the control outputting module (440) comprises an amplifying unit (441), a controlling unit (442), and a driving unit (443), the amplifying unit (441) is used to amplify the leakage current of the SCR module (10), the controlling unit (442) is used to output different control signals g based on the cut angle signal R and the lamp current signal N and then driving signals G1 are output after the control signals pass through the driving unit (443), and the amplifying unit (441), the controlling unit (442) and the driving unit (443) are connected sequentially, which is specified as follows:

when the cut angle signal R indicates that the SCR is turned off and the lamp current signal N indicates that there is no current flowing through the LED lamp, the amplifying unit 441 outputs an amplified current signal HA to the controlling unit 442 after amplifying the leakage current signal H by K times;

when the cut angle signal R indicates that the SCR is turned on and the lamp current signal N indicates that there is no current flowing through the LED lamp, the power tube M1 is controlled in such a way that the current flowing through the SCR module is equal to the current threshold or the leakage current of K times;

when the cut angle signal R indicates that the SCR is continuously turned on and the lamp current signal N indicates that there is a current flowing through the LED lamp, the power tube M1 is turned off in such a way that the current flowing through the SCR module is equal to the current in the LED lamp; and when the cut angle signal R indicates that the SCR is continuously turned on and the lamp current signal N indicates that there is no current flowing through the LED lamp again, the power tube M1 is controlled in such a way that the current flowing through the SCR module is equal to the holding current.

11. The LED SCR dimming circuit according to claim 10, wherein, the bleeder current control circuit (40) performs segmented control based on the size of the leakage current; when the SCR starts to turn on and there is no current flowing through the LED lamp, the bleeder currents of different SCR modules are controlled as one fixed value based on the leakage currents of a same value range; and different leakage current value ranges correspond to different fixed values.

12. The LED SCR dimming circuit according to claim 11, wherein, the amplifying unit (441) is set with a plurality of set voltages, the controlling unit (442) selects corresponding different control voltages for the leakage currents of different value ranges, and the driving unit (443) controls the bleeder current of the SCR module as different fixed values based on the outputs of the controlling unit (442), where the plurality is equal to or greater than two.

* * * * *